(12) United States Patent
Lee et al.

(10) Patent No.: US 8,685,836 B2
(45) Date of Patent: Apr. 1, 2014

(54) METHOD FOR FORMING A SILICON LAYER ON ANY SUBSTRATE USING LIGHT IRRADIATION

(75) Inventors: Taeyoon Lee, Seoul (KR); Ja Hoon Koo, Seoul (KR); Sang Wook Lee, Seoul (KR); Ka Young Lee, Seoul (KR)

(73) Assignee: Industry-Academic Corporation Foundation, Yonsei University, Seoul (KR)

( * ) Notice: Subject to any disclaimer, the term of this patent is extended or adjusted under 35 U.S.C. 154(b) by 27 days.

(21) Appl. No.: 13/306,455

(22) Filed: Nov. 29, 2011

(65) Prior Publication Data

US 2012/0231607 A1    Sep. 13, 2012

Related U.S. Application Data

(60) Provisional application No. 61/451,687, filed on Mar. 11, 2011.

(51) Int. Cl.
*H01L 21/306* (2006.01)

(52) U.S. Cl.
USPC ............ 438/458; 257/347; 257/E21.216; 257/E21.219; 257/E21.32; 257/E21.569; 438/689; 438/708; 438/745; 438/756

(58) Field of Classification Search
USPC ............ 257/37, E21.216, E21.219, E21.32, 257/E21.569; 438/458, 689, 708, 745, 756
See application file for complete search history.

(56) References Cited

U.S. PATENT DOCUMENTS

| 5,935,410 A * | 8/1999 | Thonissen et al. ............ 205/655 |
| 6,677,249 B2 | 1/2004 | Laermer et al. |
| 2009/0179316 A1 * | 7/2009 | Wang et al. ................... 257/676 |

FOREIGN PATENT DOCUMENTS

JP    2002-025916 A    1/2002

OTHER PUBLICATIONS

Lee et al., "Wrinkling evolution of a growing bubble: the wonders of petal-like patterns in amorphous silicon membrane", Soft Matter, vol. 6 (14), p. 3249-3256, 2010.*
Optical Microscope (2010), in the Hutchinson Unabridged Encyclopedia with Atlas and weather guide, Retrieved from http://www.xreferplus.com/entry/heliconhe/optical_microscope.*

* cited by examiner

*Primary Examiner* — Asok K Sarkar
(74) *Attorney, Agent, or Firm* — Carter, DeLuca, Farrell & Schmidt LLP

(57) ABSTRACT

A method for forming a silicon layer according to inventive concept comprises: preparing an SOI substrate; applying an etchant or vapor of the etchant to the SOI substrate; and irradiating a light to the SOI substrate.

18 Claims, 3 Drawing Sheets

METHOD FOR FORMING A SILICON LAYER ON ANY SUBSTRATE USING LIGHT IRRADIATION

CROSS-REFERENCE TO RELATED APPLICATION

This U.S. non-provisional patent application claims priority under 35 U.S.C. §119 to U.S. Provisional Ser. No. 61/451,687, filed on Mar. 11, 2011, the entire contents of which is incorporated herein by reference.

BACKGROUND

Exemplary embodiments of the inventive concepts relate to methods for manufacturing a single crystalline silicon layer capable of being transferred to and used in another substrate on which it is difficult to deposit silicon at a high temperature. More specifically, the exemplary embodiments of the inventive concepts relate to methods for manufacturing a single crystalline silicon layer capable of being easily transferred to another substrate, such as a flexible substrate, by removing an intermediate oxide layer of an SOI substrate using light irradiation and an etchant.

With research and development of technologies and materials for manufacturing high-performance electronic devices, recent research has focused on flexible devices. As representative flexible devices, organic devices using organic materials may be advantageously fabricated on various substrates such as a plastic substrate because their fabrication temperatures are low. However, there remains a lack of understanding and researching regarding the materials. Therefore, a number of researches and efforts are required for practical technology commercialization. Besides these researches, many efforts are being made to fabricate flexible devices using silicon whose performance and theory are already established.

Since the deposition temperature for a silicon layer is very high (approximately 1,400 degrees centigrade), it is not possible to directly apply the silicon layer to a flexible substrate such as plastic having poor heat resistance. In order to overcome this problem, there is proposed a method including depositing a silicon layer at a conventional high temperature, separating only the silicon layer element, and bonding the separated silicon layer element onto a flexible substrate. One of the conventional methods is that after a single crystalline silicon layer is deposited on a substrate, holes are formed at the single crystalline silicon layer at regular intervals to remove an intermediate oxide layer or make the deposited single crystalline silicon layer in the form of thin ribbon.

However, a single crystalline silicon layer is easily damaged when a hole is formed at the single crystalline silicon layer or the single crystalline silicon layer is patterned in the form of ribbon. Therefore, these methods are not suitable to obtain a intact single crystalline silicon layer. Moreover, since a large-area single crystalline silicon layer capable of being easily transferable to another substrate cannot be obtained even by the above conventional method, there is a limitation in practical fabrication of devices.

SUMMARY

Example embodiments of the inventive concepts provide a method for forming a large-area silicon layer capable of easily being transferred to another substrate.

Example embodiments of the inventive concepts provide a method for forming a silicon layer capable of being transferred to another substrate without damage and with easy.

Example embodiments of the inventive concepts provide a method for forming a transferable silicon layer.

According to some example embodiments, a method for forming a silicon layer, comprising: preparing an SOI substrate; applying an etchant or vapor of the etchant to the SOI substrate; and irradiating a light to the SOI substrate.

In other example embodiments, the light may be irradiated to the SOI substrate while the etchant or the vapor of the etchant is applied to the SOI substrate.

In further example embodiments, the etchant or the vapor of the etchant penetrates a silicon layer of the SOI substrate to reach an insulating layer of the SOI substrate and removes the oxide layer.

In yet further example embodiments, the method may further comprise, after removing the insulating layer, transferring the silicon layer onto another substrate.

In still further example embodiments, the another substrate comprises a flexible substrate.

In still further example embodiments, transferring the silicon layer onto the another substrate may comprise bonding the silicon layer onto the another substrate by using polydimethylsiloxane (PDMS).

In still further example embodiments, the etchant or the vapor of the etchant removes the insulating layer of the SOI substrate while leaving the silicon layer on a bulk silicon layer of the SOI substrate.

In still further example embodiments, the method may further comprise, before irradiating the light to the SOI substrate, disposing a microlens array on the SOI substrate to condense the light.

In still further example embodiments, the etchant comprise HF or BOE.

In still further example embodiments, the light irradiated to the SOI substrate is a visible light.

In still further example embodiment, the light irradiated to the SOI substrate has a wavelength ranging from 380 to 750 nanometers.

In still further example embodiments, applying the etchant or the vapor of the etchant to the SOI substrate may comprise dipping the SOI substrate into the etchant.

In still further embodiments, applying the etchant or the vapor of the etchant to the SOI substrate may comprise applying the vapor generated from the etchant to the SOI substrate by putting SOI substrate in an airtight space together with the chant.

According to some example embodiments, a method for forming a transferable silicon layer comprise: preparing an SOI substrate; applying an etchant or vapor of the etchant to the SOI substrate; and increasing a permeability of the etchant or the vapor of the etchant through a silicon layer of the SOI substrate to reach an insulating layer of the SOI substrate.

In other example embodiments, increasing a permeability of the etchant or the vapor of the etchant through the silicon layer may comprise irradiating a light to the SOI substrate.

In further example embodiments, the etchant or the vapor of the etchant removes the insulating layer and the silicon layer is disposed directly on the bulk silicon layer.

In yet further example embodiments, the method may further comprise transferring the silicon layer onto a target substrate.

In still further example embodiments, the target substrate may comprise a flexible substrate.

In still further example embodiments, the etchant may comprise HF or BOE solution.

According to some example embodiments, a method of forming transferable silicon layer, the method comprising:

providing an SOI substrate comprising a bulk silicon layer, an oxide layer and a single crystalline silicon layer; and removing the oxide layer while leaving the single crystalline silicon layer directly on the bulk silicon layer by irradiating a light to the SOI substrate while applying an etchant or vapor of the etchant to the SOI substrate.

According to one or more example embodiments of the inventive concepts, a single crystalline silicon layer can be freely transferred to another substrate without forming a hole at the silicon layer or patterning the silicon layer into a ribbon-type. Thus, a substrate use limitation resulting from heat generated during deposition of single crystalline silicon can be overcome. In addition, a large-area single crystalline silicon layer capable of being transferred to another substrate such as a flexible plastic substrate can be easily obtained without damage of the single crystalline silicon layer. Using a method for manufacturing a single crystalline silicon layer according to the present invention, various single crystalline silicon layer devices such as a MOS transistor, a thin film transistor (TFT), and a diode can be manufactured on a flexible substrate. Thus, a performance problem occurred in manufacturing a flexible device using an organic material can be overcome with the use of high-purity single crystalline silicon, and novel methods can be provided for the procedure of manufacturing a flexible device. Furthermore, an intact large-area single crystalline silicon layer can be obtained to maximize process efficiency.

BRIEF DESCRIPTION OF THE DRAWINGS

Example embodiments will be more clearly understood from the following brief description taken in conjunction with the accompanying drawings.

FIGS. 1 to 6 are cross-sectional views illustrating a method for manufacturing an amorphous silicon layer according to example embodiments of the inventive concepts.

Figure 1:
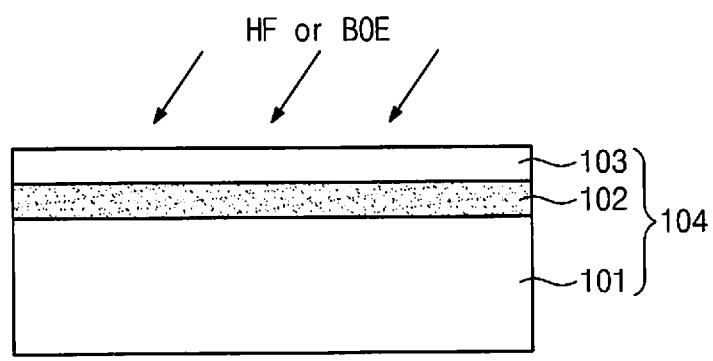
FIGS. 1 to 6 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In one embodiment of the invention, while liquid or gaseous HF or BOE is applied to a single crystalline film constituting an upper film of an SOI substrate, a visible light (e.g., white light) is irradiated to the single crystalline film to which etchant components are applied. Thus, among the etchant components, HF molecules of the etchant component increase in transmittance through the single crystalline film. For this reason, the HF molecules may reach an underlying silicon oxide layer through the single crystalline silicon layer, and etch and remove the underlying silicon oxide layer. Since the single crystalline film is not damaged by the etchant or its vapor and is not physically or chemically bonded to a bulk silicon substrate, the single crystalline film may be easily transferred to another substrate such as a flexible substrate by means of transfer printing or the like.

FIGS. 1 to 6 are cross-sectional views illustrating a method for manufacturing a single crystalline silicon layer, which may be freely transferred to another substrate, according to example embodiments of the inventive concepts.

Referring to FIG. 1, an SOI substrate 104 is prepared which has a stacked structure of silicon substrate/oxide/single crystalline silicon. The SOI substrate 104 includes a bulk substrate 101 such as a bulk silicon wafer, and a silicon oxide layer 102 and a single crystalline film 103 which are sequentially stacked on the bulk substrate 101.

Figure 2:
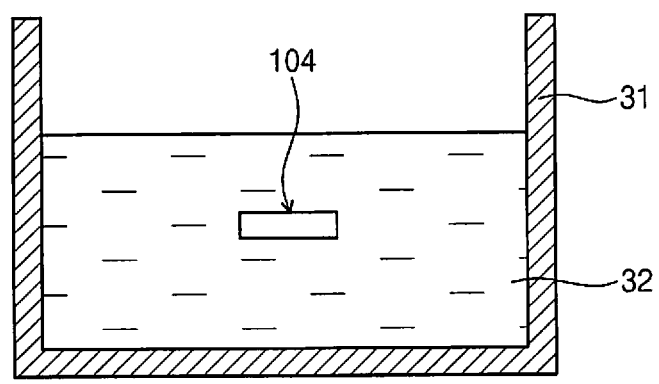
Figure 3:
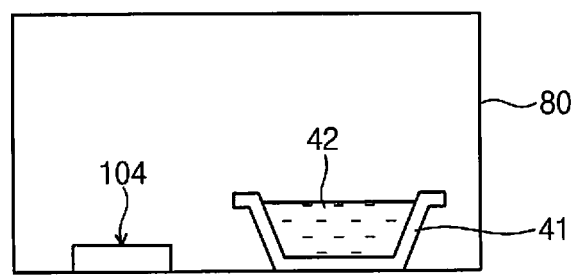

As shown in FIG. 2 or FIG. 3, an etchant 32 or vapor of an etchant 42 is applied to the single crystalline silicon layer 103 of the SOI substrate 104. An HF solution or a BOE solution may be used as the etchants 32 and 42.

An embodiment of applying an etchant or its vapor to the single crystalline silicon layer 103 is shown in FIG. 2. The SOI substrate 104 may be inserted or dipped into the HF or BOE solution 32 contained in an etching bath 31. After the dipped SOI substrate 104 is taken out of the HF or BOE solution 32, a surface of the single crystalline silicon layer 103 may be exposed to an ambient of HF solution or its vapor.

An alternative embodiment is shown in FIG. 3. If the SOI substrate 104 is put in an airtight space 80 together with the HF or BOE solution 42, etching components (HF molecules) of vapor generated from the HF or BOE solution 42 contained in a bath 41 may be applied to the single crystalline silicon layer 103 of the SOI substrate.

Figure 4:
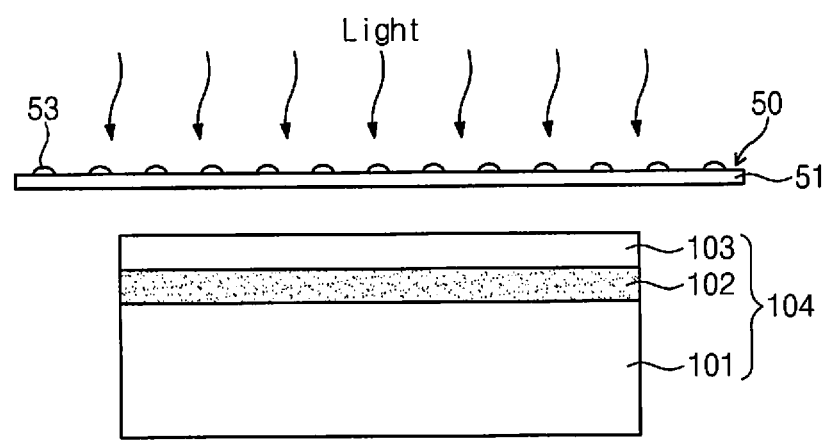

Next, as shown in FIG. 4, a microlens array 50 is disposed on the single crystalline silicon layer 103 while the HF or BOE solution or its vapor is applied to the single crystalline silicon layer 103. After concentrating light through the microlens array 50, the single crystalline silicon layer 103 is exposed to the concentrated light. For example, a visible light of white light may be irradiated to the single crystalline silicon layer 103. For example, the irradiated light may have a wavelength ranging from about 380 nanometers to about 750 nanometers. For example, the microlens array 50 may have a structure in which a plurality of microlenses 53 are arranged on a transparent substrate 51 such as glass.

As stated above, while single crystalline silicon is exposed to light, diffusion of HF molecules in an etchant is promoted in the single crystalline silicon to increase transmittance to the single crystalline silicon layer 103. Thus, the HF molecules receiving the light go through the single crystalline silicon 103 and remove a silicon oxide layer 102.

Since a crystal structure of single crystalline silicon is hard and has a short interatomic distance, HF molecules (e.g., HF molecules in an HF or BOE solution used as an etchant for silicon oxide) cannot pass through the single crystalline silicon. However, as stated above, if light is irradiated to the single crystalline silicon layer of the SOI substrate 104 while the HF or BOE solution is applied to the single crystalline silicon layer, HF, an etchant component of the solution or its vapor, increases in transmittance through the single crystalline silicon layer 103. Thus, the HF passes through the single crystalline silicon layer 103 and etches or removes the underlying silicon oxide layer 102. As a result, a large-area single crystalline silicon layer separable from a bulk wafer may be obtained.

The HF or BOE solution has a higher etch selectivity with respect to silicon oxide than with respect to single crystalline silicon. Therefore, the single crystalline silicon layer 103 is negligibly damaged and only the silicon oxide layer 102 may be removed even when the HF or BOE solution or its vapor is applied to the single crystalline silicon 103.

In the foregoing embodiments, it is been described that after light is concentrated at a plurality of positions through the microlens array 50, the light is irradiated to the single crystalline silicon layer 103 to concentrate transmittance of etchant components at the plurality of positions. However, the invention is not limited thereto. For example, light may be directly irradiated to a single crystalline silicon layer (to which etchant components are applied) without the microlens array 50.

Figure 5:
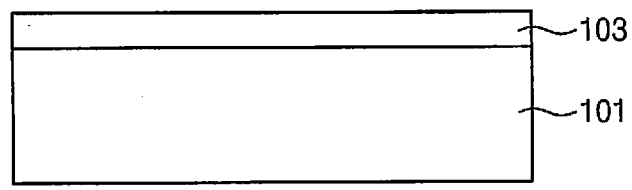

Through the processes described with reference to FIGS. 1 to 4, the silicon oxide layer 102 is removed to obtain a single crystalline silicon layer 103 simply placed on a substrate 101 such as a silicon wafer, as shown in FIG. 5. Since the single crystalline silicon layer 103 exists in the state of being placed on the substrate 101 without substantial chemical and mechanical bonding to the substrate 101, it may be easily transferred to another substrate.

Figure 6:
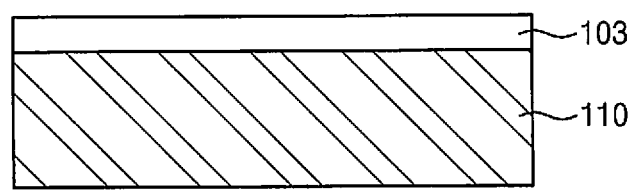

FIG. 6 shows a single crystalline silicon layer 103 transferred from a substrate 101 onto another substrate 130. As an embodiment, a single crystalline silicon layer 103 in the state of being freely transferable to another substrate while being simply placed on a substrate 101 (see FIG. 5) may be easily extracted from the substrate 101 with the use of polydimethylsiloxane (PDMS) and bonded onto another substrate 130. The single crystalline silicon layer 103 may be easily transferred and bonded onto another substrate 110 such as a flexible substrate (e.g., PET substrate). A single crystalline silicon layer transferred onto another desired substrate may be usefully applied to manufacture a silicon layer device, such as an MOS transistor, a thin film transistor (TFT), and diode, on a flexible substrate.

While the invention has been particularly shown and described with reference to exemplary embodiments thereof, it will be apparent to those of ordinary skill in the art that various changes in form and detail may be made therein without departing from the spirit and scope of the inventive concept as defined by the following claims.

While example embodiments have been particularly shown and described, it will be understood by one of ordinary skill in the art that variations in form and detail may be made therein without departing from the spirit and scope of the claims.

What is claimed is:

1. A method for forming a silicon layer, comprising:
preparing an SOI substrate; and
removing an insulating layer of the SOI substrate by irradiating a light to the SOI substrate while applying an etchant or vapor of the etchant to the SOI substrate.

2. The method as set forth in claim 1, wherein the etchant or the vapor of the etchant penetrates a silicon layer of the SOI substrate to reach the insulating layer of the SOI substrate and removes the insulating layer of the SOI substrate.

3. The method as set forth in claim 2, further comprising, after removing the insulating layer, transferring a silicon layer of the SOI substrate onto a second substrate.

4. The method as set forth in claim 3, wherein the second substrate comprises a flexible substrate.

5. The method as set forth in claim 3, wherein transferring the silicon layer onto the second substrate comprises bonding the silicon layer onto the second substrate by using polydimethylsiloxane (PDMS).

6. The method as set forth in claim 1, wherein the etchant or the vapor of the etchant removes the insulating layer of the SOI substrate while leaving a silicon layer of the SOI substrate on a bulk silicon layer of the SOI substrate.

7. The method as set forth in claim 1, further comprising, before irradiating the light to the SOI substrate, disposing a microlens array on the SOI substrate to condense the light.

8. The method as set forth in claim 1, wherein the etchant comprises HF or BOE.

9. The method as set forth in claim 1, wherein the light irradiated to the SOI substrate is a visible light.

10. The method as set forth in claim 1, wherein the light irradiated to the SOI substrate has a wavelength ranging from 380 to 750 nanometers.

11. The method as set forth in claim 1, wherein applying the etchant or the vapor of the etchant to the SOI substrate comprises dipping the SOI substrate into the etchant.

12. The method as set forth in claim 1, wherein applying the etchant or the vapor of the etchant to the SOI substrate comprises applying the vapor generated from the etchant to the SOI substrate by putting SOI substrate in an airtight space together with the etchant.

13. A method for forming a transferable silicon layer, the method comprising:
   preparing an SOI substrate;
   applying an etchant or vapor of the etchant to the SOI substrate; and
   reaching an insulating layer of the SOI substrate and removing the insulating layer by increasing a permeability of the etchant or the vapor of the etchant through a silicon layer of the SOI substrate, wherein increasing a permeability of the etchant or the vapor of the etchant through the silicon layer comprises irradiating a light to the SOI substrate.

14. The method as set forth in claim 13, wherein the etchant or the vapor of the etchant removes the insulating layer and the silicon layer is disposed directly on the bulk silicon layer.

15. The method as set forth in claim 14, further comprising transferring the silicon layer onto a target substrate.

16. The method as set forth in claim 15, wherein the target substrate comprises a flexible substrate.

17. The method as set forth in claim 13, wherein the etchant comprises HF or BOE solution.

18. A method of forming a transferrable silicon layer, the method comprising:
   providing an SOI substrate including a bulk silicon layer, an oxide layer and a single crystalline silicon layer; and
   removing the oxide layer while leaving the single crystalline silicon layer directly on the bulk silicon layer by irradiating a light to the SOI substrate while applying an etchant or vapor of the etchant to the SOI substrate.

* * * * *